(12) United States Patent
Kubota

(10) Patent No.: US 11,898,840 B2
(45) Date of Patent: Feb. 13, 2024

(54) MEASURING DEVICE AND METHOD OF OBTAINING THICKNESS OF SHEATH

(71) Applicant: TOKYO ELECTRON LIMITED, Tokyo (JP)

(72) Inventor: Shinji Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 359 days.

(21) Appl. No.: 17/356,230

(22) Filed: Jun. 23, 2021

(65) Prior Publication Data

US 2021/0396506 A1 Dec. 23, 2021

(30) Foreign Application Priority Data

Jun. 23, 2020 (JP) .................. 2020-107803

(51) Int. Cl.
*G01B 7/06* (2006.01)
*H01J 37/32* (2006.01)
(52) U.S. Cl.
CPC .......... *G01B 7/085* (2013.01); *H01J 37/3222* (2013.01); *H01J 37/32816* (2013.01)
(58) Field of Classification Search
CPC ..................................................... G01B 7/085
See application file for complete search history.

(56) References Cited

U.S. PATENT DOCUMENTS

2013/0112352 A1* 5/2013 Hirayama ............... B05C 13/00
118/723 MW

FOREIGN PATENT DOCUMENTS

JP 2002-353199 A 12/2002

* cited by examiner

*Primary Examiner* — Paresh Patel
(74) *Attorney, Agent, or Firm* — XSENSUS LLP

(57) ABSTRACT

A measuring device includes a substrate disposed on a substrate support of a plasma processing apparatus, a transmission circuit, a transmitting antenna, a receiving antenna, a reception demodulation circuit, and a calculator which are provided in the substrate. The transmission circuit generates a microwave. The transmitting antenna transmits the microwave generated by the transmission circuit as a transmission wave. The receiving antenna receives a reflected wave of the transmission wave by plasma above the substrate support as at least one reception wave. The reception demodulation circuit generates a signal that reflects a thickness of a sheath between the substrate and the plasma, from the reception wave. The calculator obtains the thickness of the sheath from the signal generated by the reception demodulation circuit.

15 Claims, 13 Drawing Sheets

MEASURING DEVICE AND METHOD OF OBTAINING THICKNESS OF SHEATH

CROSS-REFERENCE TO RELATED APPLICATIONS

This application is based on and claims priority from Japanese Patent Application No. 2020-107803, filed on Jun. 23, 2020, with the Japan Patent Office, the disclosure of which is incorporated herein in its entirety by reference.

TECHNICAL FIELD

The present disclosure relates to a measuring device and a method of obtaining a thickness of a sheath.

BACKGROUND

A plasma processing apparatus is used for manufacturing electronic devices. The plasma processing apparatus includes a chamber and a substrate support. The substrate support supports a substrate in the chamber. When plasma is generated in the chamber, a sheath (plasma sheath) is formed between the substrate disposed on the substrate support and the plasma. The thickness of the sheath affects a plasma processing on the substrate.

Japanese Laid-Open Patent Publication No. 2002-353199 describes a plasma processing apparatus capable of obtaining the thickness of the sheath. The plasma processing apparatus is provided with a laser length measuring unit for measuring the thickness of the sheath.

SUMMARY

In an embodiment, a measuring device is provided. The measuring device includes a substrate, a transmission circuit, a transmitting antenna, at least one receiving antenna, a reception demodulation circuit, and a calculator. The substrate is placeable on a substrate support of a plasma processing apparatus. The transmission circuit, the transmitting antenna, the at least one receiving antenna, the reception demodulation circuit, and the calculator are provided inside or on the substrate. The transmission circuit is configured to generate a microwave. The transmitting antenna is configured to transmit the microwave generated by the transmission circuit as a transmission wave. The at least one receiving antenna is configured to receive a reflected wave of the transmission wave by plasma above the substrate support as at least one reception wave. The reception demodulation circuit is configured to generate at least one signal that reflects a thickness of a sheath between the substrate and the plasma, from the at least one reception wave. The calculator is configured to obtain the thickness of the sheath from the at least one signal.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
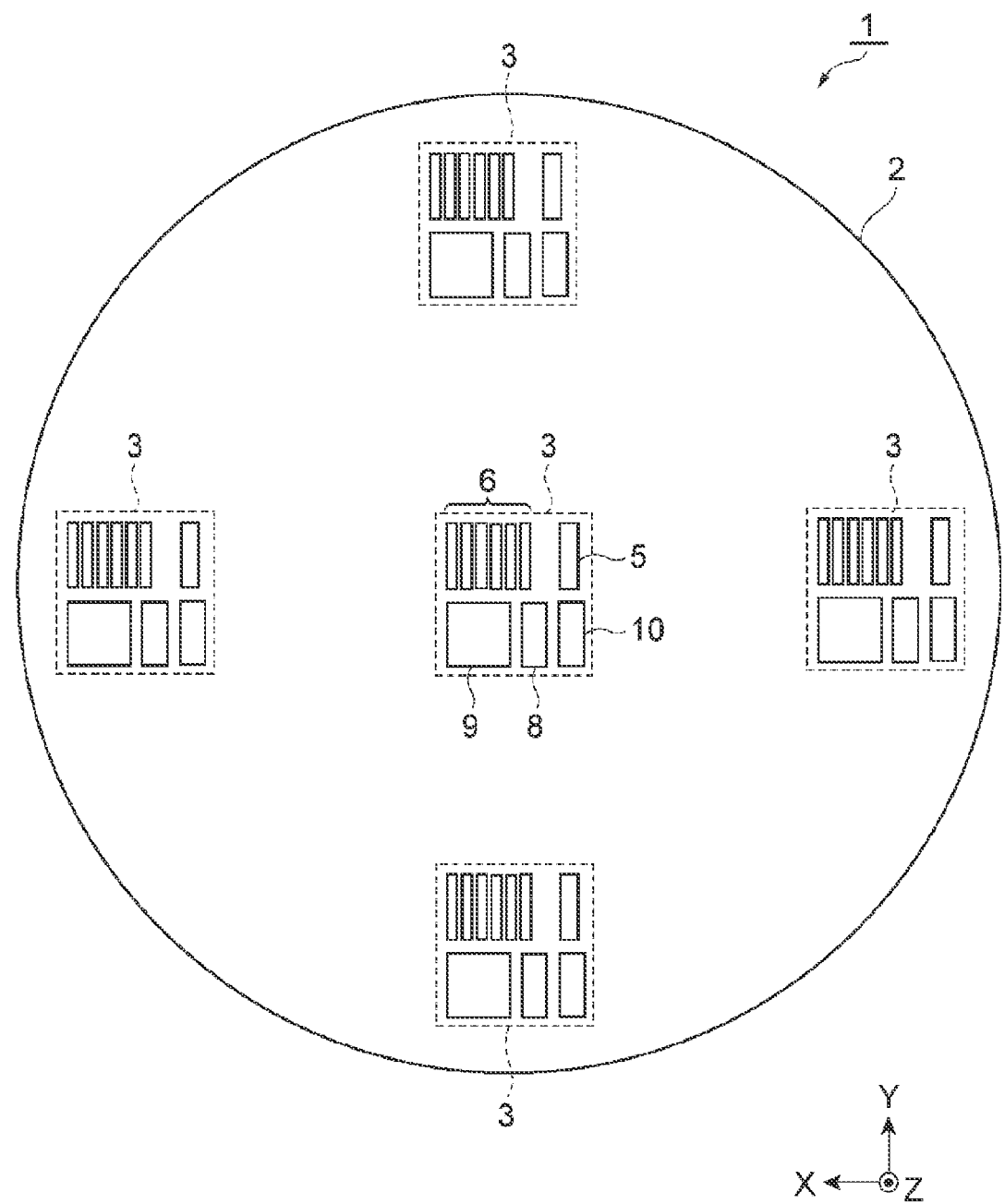
FIG. 1 is a plan view of a measuring device according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described.

In an embodiment, a measuring device is provided. The measuring device includes a substrate, a transmission circuit, a transmitting antenna, at least one receiving antenna, a reception demodulation circuit, and a calculator. The substrate is placeable on a substrate support of a plasma processing apparatus. The transmission circuit, the transmitting antenna, the at least one receiving antenna, the reception demodulation circuit, and the calculator are provided inside or on the substrate. The transmission circuit is configured to generate a microwave. The transmitting antenna is configured to transmit the microwave generated by the transmission circuit as a transmission wave. The at least one receiving antenna is configured to receive a reflected wave of the transmission wave by plasma above the substrate support as at least one reception wave. The reception demodulation circuit is configured to generate at least one signal that reflects a thickness of a sheath between the substrate and the plasma, from the at least one reception wave. The calculator is configured to obtain the thickness of the sheath from the at least one signal.

In the measuring device of the embodiment described above, the components used for obtaining the thickness of the sheath, that is, the transmission circuit, the transmitting antenna, the at least one receiving antenna, the reception demodulation circuit, and the calculator are provided inside or on the substrate that is placeable on the substrate support of the plasma processing apparatus. Accordingly, plasma is generated in a state where the measuring device is provided on the substrate support, so that the thickness of the sheath may be obtained without providing a dedicated measuring device in the plasma processing apparatus.

In an embodiment, the transmission direction of the transmission wave from the transmitting antenna on the substrate support may be an obliquely upward direction. The measuring device may include a plurality of receiving antennas as the at least one receiving antenna. The plurality of receiving antennas may be arranged along a direction component of the transmission direction of the transmission wave which is parallel to the substrate. The reception demodulation circuit may be configured to generate a plurality of signals that represents intensities of a plurality of reception waves received by the plurality of receiving antennas, respectively. The calculator may be configured to obtain the thickness of the sheath from the plurality of signals.

In an embodiment, the transmitting antenna may transmit a pulse of the microwave output from the transmission circuit as the transmission wave. The reception demodulation circuit may be configured to generate the at least one signal that represents an intensity of the at least one reception wave. The calculator may be configured to obtain a delay time of the at least one reception wave with respect to the transmission wave from the at least one signal, and obtain the thickness of the sheath from the delay time.

In an embodiment, the measuring device may include a plurality of receiving antennas as the at least one receiving antenna. The plurality of receiving antennas may be arranged along a direction component of the transmission direction of the transmission wave which is parallel to the substrate. The reception demodulation circuit may be configured to generate a plurality of signals that represents intensities of the plurality of reception waves received by the plurality of receiving antennas, respectively. The calculator may be configured to obtain a plurality of delay times of the plurality of reception waves, respectively, with respect to the transmission wave from the plurality of signals, and obtain the thickness of the sheath from the plurality of delay times.

In an embodiment, the reception demodulation circuit may be configured to generate the at least one signal that represents a phase difference between the transmission wave and the at least one reception wave.

In an embodiment, the transmission circuit may be configured to cause a frequency of the transmission wave to alternately and monotonically increase and decrease. The reception demodulation circuit may be configured to mix the transmission wave and the at least one reception wave, thereby generating an intermediate frequency signal having a beat frequency that reflects the thickness of the sheath as the at least one signal.

In an embodiment, the transmission circuit may be configured to scan the transmission direction of the transmission wave to increase and decrease an angle formed by the transmission direction of the transmission wave with respect to the substrate in synchronization with a reference signal having a predetermined frequency lower than the frequency of the transmission wave. The reception demodulation circuit may be configured to generate a signal of a predetermined frequency component that is included in the at least one reception wave, as the at least one signal. The calculator may be configured to obtain the thickness of the sheath from a phase difference between the reference signal and the at least one signal.

In an embodiment, the transmission wave may be a millimeter wave.

In another embodiment, a method of obtaining a thickness of a sheath is provided. The method includes: (a) placing a measuring device on a substrate support in a chamber of a plasma processing apparatus. The measuring device includes a substrate, a transmission circuit, a transmitting antenna, at least one receiving antenna, a reception demodulation circuit, and a calculator. The substrate is placeable on the substrate support of the plasma processing apparatus. The transmission circuit, the transmitting antenna, the at least one receiving antenna, the reception demodulation circuit, and the calculator are provided inside or on the substrate. The transmission circuit is configured to generate a microwave. The transmitting antenna is configured to transmit the microwave generated by the transmission circuit as a transmission wave. The at least one receiving antenna is configured to receive a reflected wave of the transmission wave by plasma above the substrate support as the at least one reception wave. The reception demodulation circuit is configured to generate at least one signal that reflects the thickness of the sheath between the substrate and the plasma, from the at least one reception wave. The calculator is configured to obtain the thickness of the sheath from the at least one signal. The method further includes: (b) generating plasma in the chamber of the plasma processing apparatus; and (c) while the plasma is generated in the chamber, obtaining the thickness of the sheath from the at least one signal in the calculator of the measuring device placed on the substrate support.

Hereinafter, various embodiments will be described with reference to the drawings. In the respective drawings, similar or corresponding portions will be denoted by the same reference numerals.

FIG. 1 is a plan view of a measuring device according to an embodiment. As illustrated in FIG. 1, a measuring device 1 is configured to measure the thickness of a sheath between plasma and the measuring device 1 on a substrate support provided in the chamber of a plasma processing apparatus. The measuring device 1 is provided with a substrate 2. The substrate 2 may be placed on the substrate support of the plasma processing apparatus. The substrate 2 may have a disk shape similar to a wafer. The substrate 2 is formed of, for example, silicon.

Figure 2:
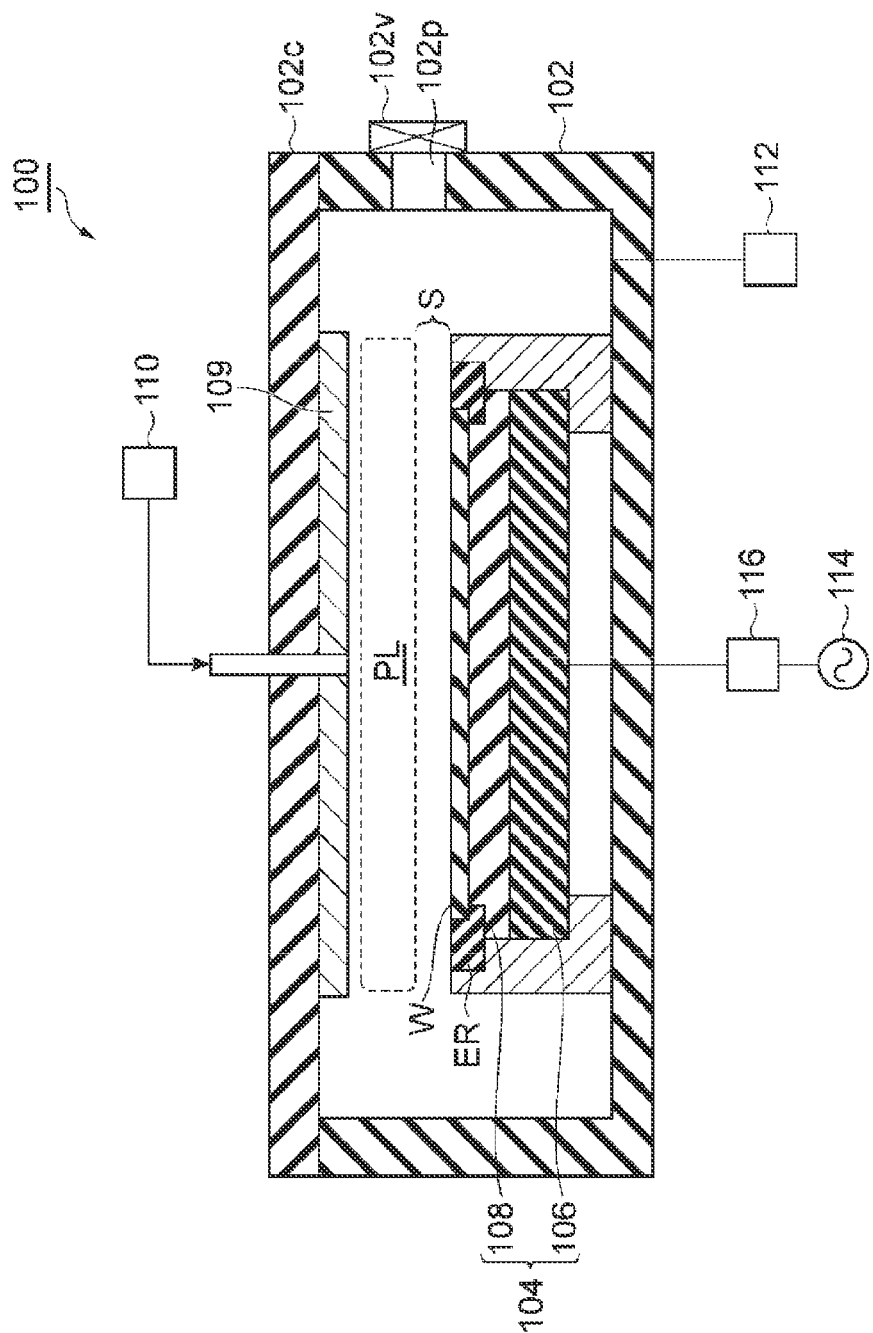
FIG. 2 is a view schematically illustrating an example of a plasma processing apparatus.

FIG. 2 is a view schematically illustrating an example of the plasma processing apparatus. The measuring device 1 is able to measure the thickness of the sheath on a substrate support 104 of a plasma processing apparatus 100 illustrated in FIG. 2. The measuring device 1 may be used for measuring the thickness of the sheath in another plasma processing apparatus.

As illustrated in FIG. 2, the plasma processing apparatus 100 includes a conductor 106. The chamber 102 provides a passage 102p in the side wall thereof. The substrate W to be processed in the plasma processing apparatus 100 and the measuring device 1 pass through the passage 102p when the substrate W and the measuring device 1 are transferred between the inside and the outside of the chamber 102. The passage 102p is openable/closable by a gate valve 102v.

The plasma processing apparatus 100 further includes the substrate support 104. The substrate support 104 is provided inside the chamber 102. The substrate support 104 is configured to support the substrate W placed thereon. The substrate support 104 may support the measuring device 1 placed thereon.

The substrate support 104 may include a lower electrode 106 and an electrostatic chuck 108. The lower electrode 106 is formed of, for example, a conductor such as aluminum, and has a substantially disk shape. The electrostatic chuck 108 is provided on the lower electrode 106. The electrostatic chuck 108 is configured to hold the substrate W or the measuring device 1 placed thereon by an electrostatic attraction force.

The substrate support 104 may support an edge ring ER provided thereon. The edge ring ER has a ring shape. The edge ring ER is formed of, for example, a silicon-containing material. The substrate W or the measuring device 1 is placed within the area surrounded by the edge ring ER on the electrostatic chuck 108.

The plasma processing apparatus may further include an upper electrode 109. The upper electrode 109 is supported by the ceiling 102c of the chamber 102. The upper electrode 109 may be grounded.

The plasma processing apparatus 100 may further include a gas supply 110 and an exhaust device 112. The gas supply 110 is configured to supply a gas into the chamber 102. In FIG. 2, the gas supply 110 supplies a gas from the upper electrode 109 into the chamber 102 through the ceiling 102c of the chamber 102. However, the gas supply 110 may supply a gas from another position into the chamber 102. The exhaust device 112 includes a pressure controller such as an automatic pressure control valve, and a decompression pump such as a turbo molecular pump or a dry pump. The exhaust device 112 is configured to adjust the pressure of a gas in the chamber 102 to a designated pressure.

The plasma processing apparatus 100 may further include a radio frequency power supply 114. The radio frequency power supply 114 is connected to the lower electrode 106 via a matching device 116. The radio frequency power supply 114 supplies a radio frequency power to the lower electrode 106 in order to generate plasma from a gas in the chamber 102. The matching device 116 includes a matching circuit that matches the load impedance of the radio frequency power supply 114 with the output impedance of the radio frequency power supply 114.

When plasma is generated in the plasma processing apparatus 100, a gas is supplied from the gas supply 110 into the chamber 102. The exhaust device 112 adjusts the pressure of the gas in the chamber 102. Further, the radio frequency power is supplied from the radio frequency power supply 114 to the lower electrode 106. As a result, plasma PL is generated in the chamber 102. A sheath S is formed between the plasma PL and the substrate W or the measuring device 1 on the substrate support 104.

The measuring device 1 further includes one or more measuring units 3 in order to measure the thickness of the sheath S on the substrate support 104. In FIG. 1, the measuring device 1 includes five measuring units 3. However, the number of measuring units 3 in the measuring device 1 may be one or any of two or more. In FIG. 1, among the plurality of measuring units 3, one measuring unit is provided at the center of the substrate 2, and the other measuring units are arranged at equal intervals on the circle around the center of the substrate 2. However, the one or more measuring units 3 may be arranged at any positions on the substrate 2. Further, each of the one or more measuring units 3 may be provided in the form of a chip on the substrate 2. Alternatively, each of the one or more measuring units 3 may be formed inside or on the substrate 2.

Figure 3:
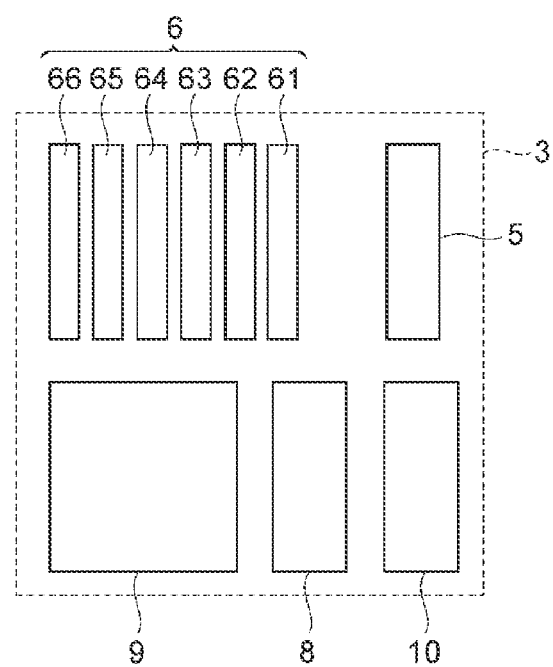
FIG. 3 is a plan view illustrating one measuring unit of the measuring device according to the embodiment.
Figure 4:
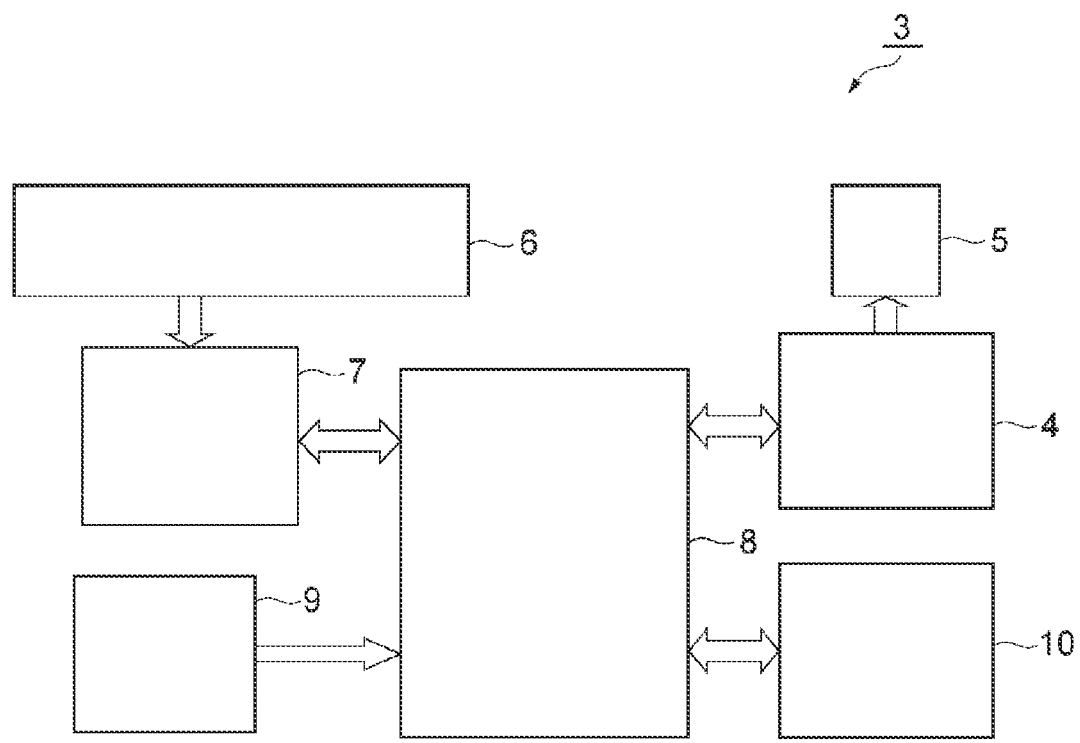
FIG. 4 is a view illustrating a configuration of one measuring unit of the measuring device according to the embodiment.

Hereinafter, FIGS. 3 and 4 will be referred-to, along with FIG. 1. FIG. 3 is a plan view illustrating one measuring unit of the measuring device according to the embodiment. FIG. 4 is a view illustrating a configuration of the measuring unit of the measuring device according to the embodiment. Hereinafter, one measuring unit 3 will be described. When the measuring device 1 includes the plurality of measuring units 3, the plurality of measuring units 3 may have the same configuration.

The measuring unit 3 includes a transmission circuit 4, a transmitting antenna 5, at least one receiving antenna 6, a reception demodulation circuit 7, and a calculator 8. The number of receiving antennas 6 in the measuring unit 3 may be one or any of two or more. The measuring unit 3 may further include a battery 9 and a memory 10. The battery 9 is, for example, an all-solid-state battery. The battery 9 is an operation power source of each component (e.g., the calculator 8) of the measuring unit 3. The memory 10 is a storage unit for programs and data, and is connected to the calculator 8. The components of the measuring unit 3, that is, the transmission circuit 4, the transmitting antenna 5, the at least one receiving antenna 6, the reception demodulation circuit 7, the calculator 8, the battery 9, and the memory 10 are provided inside or on the substrate 2.

The transmission circuit 4 is configured to generate a microwave. The frequency of the microwave generated in the transmission circuit 4 may be any frequency within a microwave band. The frequency of the microwave generated in the transmission circuit 4 may be a frequency within a millimeter wave band. The millimeter wave band is a frequency band of 30 GHz or more and 300 GHz or less. Alternatively, the frequency of the microwave generated in the transmission circuit 4 may be a frequency within a submillimeter wave band. The submillimeter wave band is a frequency band of 300 GHz or more.

Figure 5:
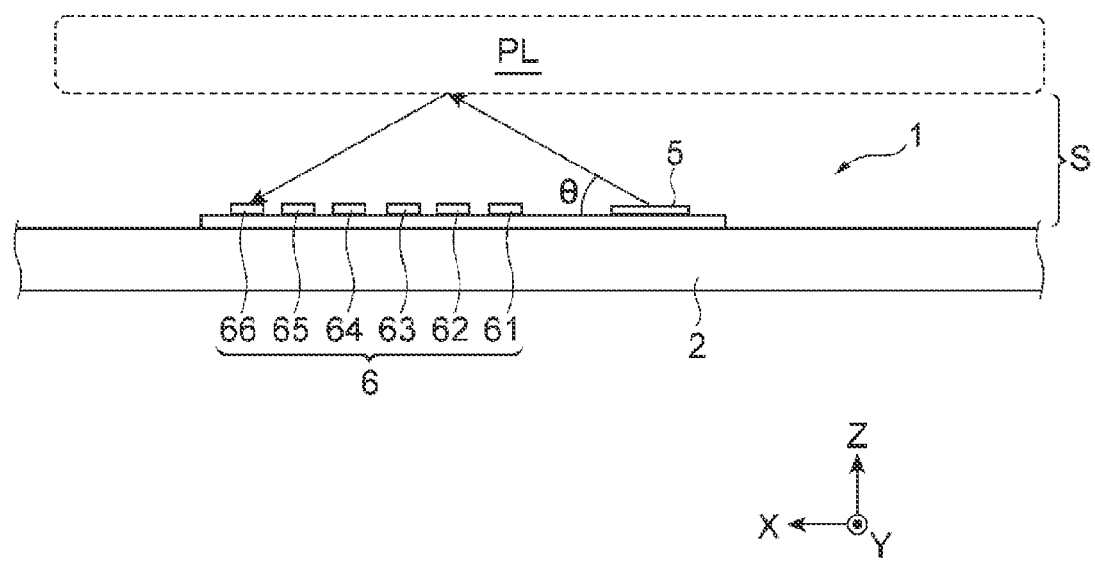
FIG. 5 is a view illustrating a transfer of a microwave between a transmitting antenna and a receiving antenna of the measuring device according to the embodiment.

The transmitting antenna 5 is connected to the transmission circuit 4. The transmitting antenna 5 is configured to transmit the microwave generated by the transmission circuit 4 as a transmission wave. FIG. 5 is a view illustrating the transfer of the microwave between the transmitting antenna and the receiving antenna of the measuring device according to the embodiment. As illustrated in FIG. 5, the transmission wave transmitted from the transmitting antenna 5 has a directivity such that the transmission wave is reflected by the plasma PL at the interface between the plasma PL and the sheath S, and received as a reception wave by the at least one receiving antennas 6. The transmission direction of the transmission wave transmitted from the transmitting antenna 5 is the main axis direction of the transmission wave.

Figure 6A:
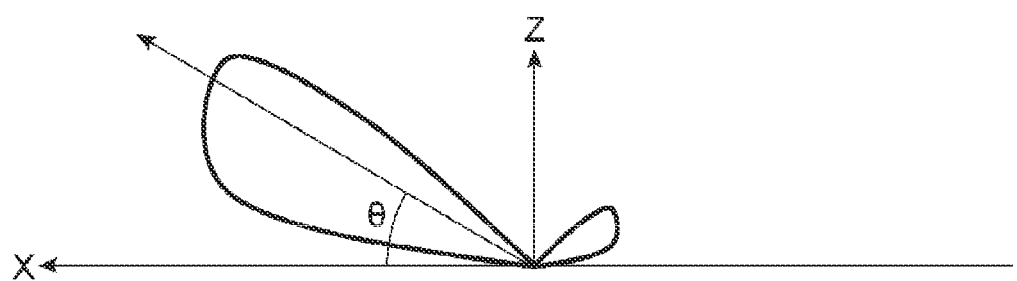
FIGS. 6A and 6B are views illustrating a transmission direction of a transmission wave in the measuring device according to the embodiment.
Figure 6B:
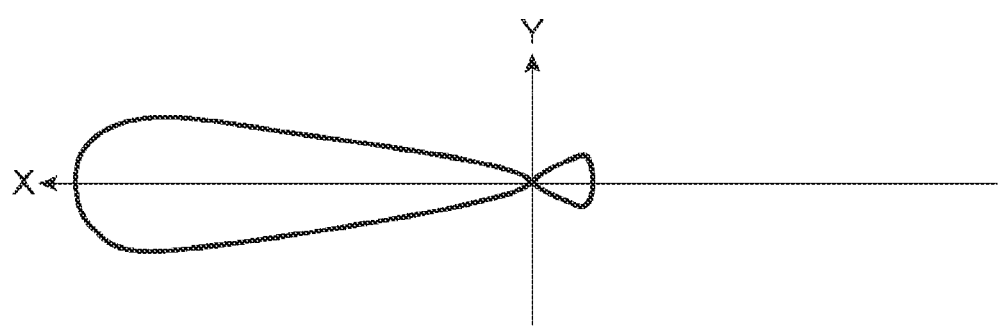

FIGS. 6A and 6B are views illustrating the transmission direction of the transmission wave in the measuring device according to the embodiment. FIGS. 6A and 6B represent the main lobe and the side lobe of the transmission wave. In FIGS. 6A and 6B, the X direction is parallel to the substrate 2. The transmitting antenna 5 and the receiving antenna 6 are arranged along the X direction. The Y direction is parallel to the substrate 2 and orthogonal to the X direction. The Z direction is orthogonal to the substrate 2, the X direction, and the Y direction, and is a vertical direction in a state where the measuring device 1 is placed on the substrate support 104. As illustrated in FIGS. 6A and 6B, the transmission direction of the transmission wave is obliquely upward on the substrate support 104. The direction component of the transmission direction of the transmission wave which is parallel to the substrate 2 is the X direction.

Figure 7:
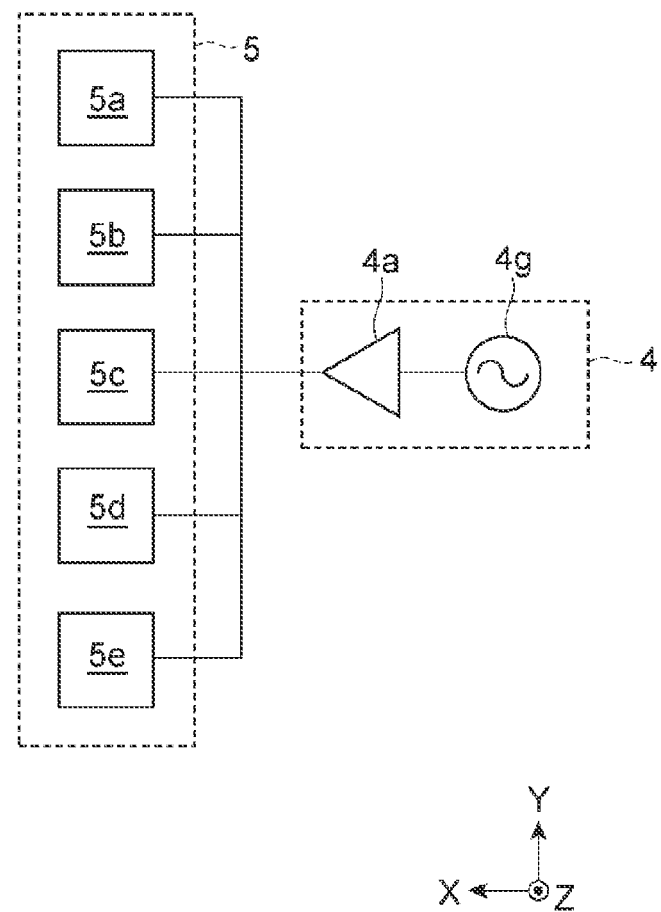
FIG. 7 is a plan view illustrating an example of a transmitting antenna that may be adopted in the measuring device according to the embodiment.

The transmitting antenna 5 may include one or more antenna elements. The one or more antenna elements include a radiation conductor. FIG. 7 is a plan view illustrating an example of the transmitting antenna that may be adopted in the measuring device according to the embodiment. The transmitting antenna 5 illustrated in FIG. 7 includes a plurality of antenna elements, that is, antenna elements 5a to 5e. Each of the antenna elements 5a to 5e includes a radiation conductor. The radiation conductor of each of the antenna elements 5a to 5e may have a rectangular planar shape. The antenna elements 5a to 5e are arranged along the Y direction. The antenna elements 5a to 5e are connected to the transmission circuit 4. In the example illustrated in FIG. 7, the transmission circuit 4 includes a microwave oscillator 4g and an amplifier 4a. The oscillator 4g is connected to the antenna elements 5a to 5e via the amplifier 4a. According to the transmitting antenna 5 illustrated in FIG. 7, a transmission wave is transmitted in which the direction component of the transmission direction thereof which is parallel to the substrate 2 is the X direction. Additionally, the number of the plurality of antenna elements arranged along the Y direction in the transmitting antenna 5 may be arbitrary.

Figure 8:
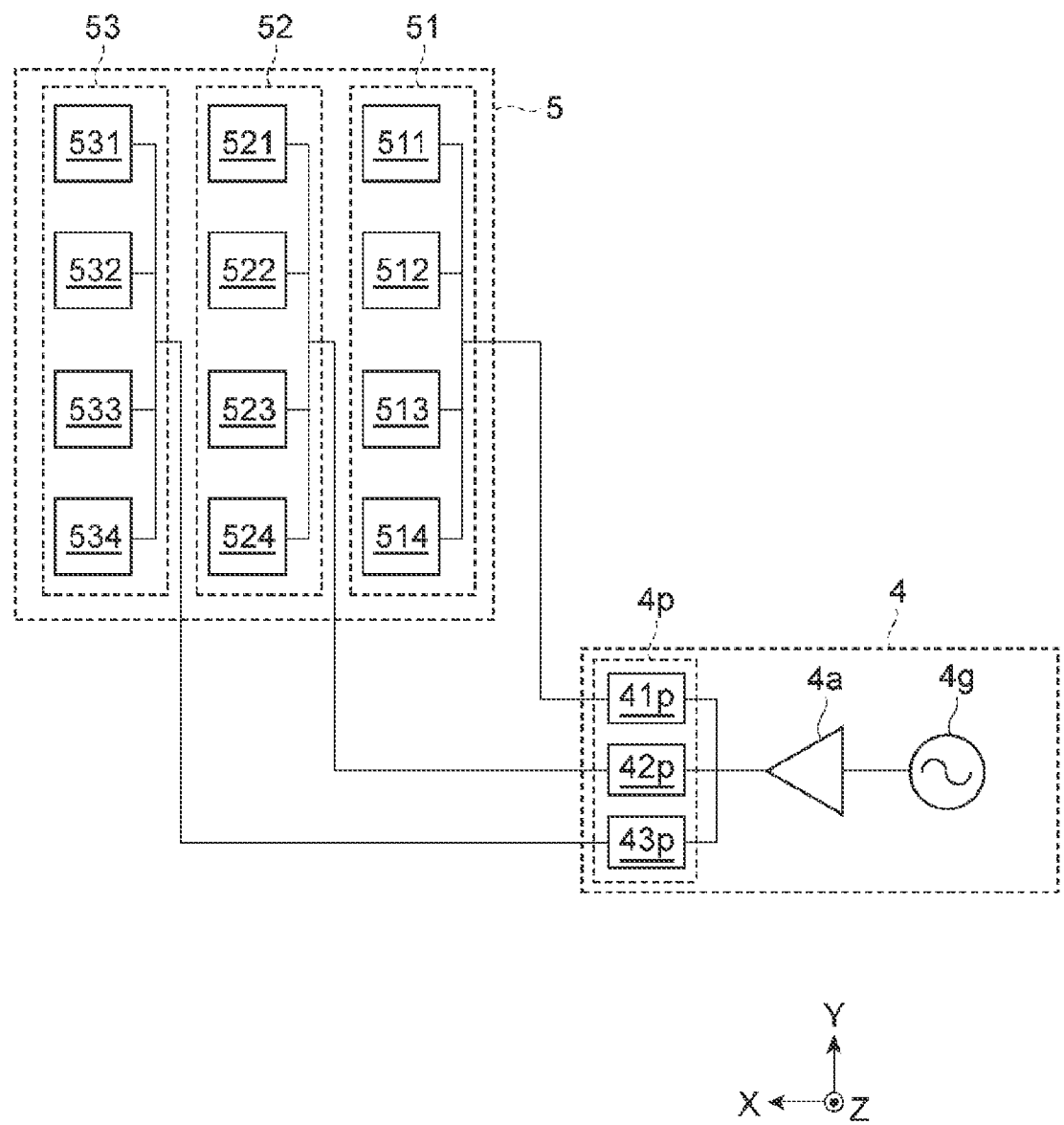
FIG. 8 is a plan view illustrating another example of the transmitting antenna that may be adopted in the measuring device according to the embodiment.

FIG. 8 is a plan view illustrating another example of the transmitting antenna that may be adopted in the measuring device according to the embodiment. The transmitting antenna 5 illustrated in FIG. 8 includes a plurality of antenna element groups 51 to 53. The number of antenna element groups in the transmitting antenna 5 may be an arbitrary number of two or more. The plurality of antenna element groups 51 to 53 are arranged along the X direction.

Each of the plurality of antenna element groups 51 to 53 includes a plurality of antenna elements. The antenna element group 51 includes antenna elements 511 to 514. The antenna element group 52 includes antenna elements 521 to 524. The antenna element group 53 includes antenna elements 531 to 534. The number of antenna elements included in each of the plurality of antenna element groups 51 to 53 may be an arbitrary number of two or more. Each of the antenna elements includes a radiation conductor. The radiation conductor may have a rectangular planar shape. In each of the plurality of antenna element groups 51 to 53, the plurality of antenna elements are arranged along the Y direction.

The plurality of antenna elements of the transmitting antenna 5 illustrated in FIG. 8 are connected to the transmission circuit 4. The transmission circuit 4 includes a microwave oscillator 4g, an amplifier 4a, and a phase shifter group 4p. The oscillator 4g is connected to the transmitting antenna 5 via the amplifier 4a and the phase shifter group 4p. The phase shifter group 4p includes phase shifters 41p, 42p, and 43p. The phase shifter 41p is connected between the amplifier 4a and the antenna element group 51. The phase shifter 42p is connected between the amplifier 4a and the antenna element group 52. The phase shifter 43p is connected between the amplifier 4a and the antenna element group 53. The microwave output from the amplifier 4a is distributed to the phase shifters 41p, 42p, and 43p as a plurality of microwaves. The plurality of microwaves are given to the plurality of antenna element groups 51 to 53, respectively, after individual phases are given to the phase shifters 41p, 42p, and 43p, respectively. The transmission wave from the transmitting antenna 5 is a composite wave of microwaves emitted from the plurality of antenna element groups 51 to 53. The angle θ of the transmission direction of the transmission wave from the transmitting antenna 5 with respect to the substrate 2 is adjusted by the phases set for the plurality of microwaves in the phase shifters 41p, 42p, and 43p, respectively.

Referring back to FIGS. 1, 3, and 4, the at least one receiving antenna 6 is configured to receive the reflected wave of the transmission wave by the plasma PL, as a reception wave. As illustrated in FIG. 3, the measuring unit 3 includes the plurality of receiving antennas 61 to 66 as the at least one receiving antenna 6. The plurality of receiving antennas 61 to 66 are arranged along the X direction. The number of receiving antennas 6 in the measuring unit 3 may be an arbitrary number of one or more. The at least one receiving antenna 6 is connected to the reception demodulation circuit 7.

The reception demodulation circuit 7 receives at least one reception wave received by the at least one receiving antenna 6. The reception demodulation circuit 7 is configured to generate at least one signal from the at least one reception wave. The at least one signal generated by the reception demodulation circuit 7 reflects the thickness of the sheath S between the substrate 2 and the plasma PL. The reception demodulation circuit 7 is connected to the calculator 8.

The calculator 8 receives the at least one signal from the reception demodulation circuit 7. The calculator 8 is configured to obtain the thickness of the sheath S from the at least one signal received from the reception demodulation circuit 7. The calculator 8 may execute a program stored in the memory 10 so as to execute an arithmetic operation for calculating the thickness of the sheath S. The calculator 8 may execute a program stored in the memory 10 so as to control the transmission circuit 4 of the measuring unit 3. The calculator 8 may be configured as a processor such as a CPU.

In the measuring device 1, the components used for obtaining the thickness of the sheath S, that is, the transmission circuit 4, the transmitting antenna 5, the at least one receiving antenna 6, the reception demodulation circuit 7, and the calculator 8 are provided inside or on the substrate 2 that may be placed on the substrate support of the plasma processing apparatus. Accordingly, by generating the plasma PL in a state where the measuring device 1 is placed on the substrate support 104, the thickness of the sheath S may be obtained without providing a dedicated measuring device in the plasma processing apparatus. Further, according to the measuring device 1, the thickness of the sheath S may be obtained in a substantially similar state to the state where the substrate W is processed in the plasma processing apparatus. Further, the measuring device 1 may be used for measuring the thickness of the sheath in any plasma processing apparatus provided with a substrate support on which the substrate 2 may be placed. Further, the measuring device 1 may be easily replaced even when a failure occurs.

Hereinafter, descriptions will be made on a method of obtaining the thickness of the sheath according to an embodiment. In the method, the measuring device 1 is used. The method of obtaining the thickness of the sheath will be described, referring to a case where the measuring device 1 is applied to the plasma processing apparatus 100, as an example.

In the method, first, the measuring device 1 is placed on the substrate support 104 in the chamber 102 of the plasma processing apparatus 100. The measuring device 1 is transferred from the inside of a load port of a substrate processing system that includes the plasma processing apparatus 100 into the chamber 102 through a transfer system, and placed on the substrate support 104. Then, the measuring device 1 is held by the electrostatic chuck 108. Then, the circuit operation of the measuring device 1 is started.

Next, the plasma PL is generated in the chamber of the plasma processing apparatus 100. A gas is supplied from the gas supply 110 into the chamber 102 in order to generate the plasma PL. Further, the pressure of the gas in the chamber 102 is adjusted by the exhaust device 112. Then, the radio frequency power from the radio frequency power supply 114 is supplied to the lower electrode 106. As a result, the plasma PL is generated above the measuring device 1 inside the chamber 102.

In this method, when the plasma PL is being generated, the calculator 8 of the measuring device 1 obtains the thickness of the sheath S, using the at least one signal from the reception demodulation circuit 7 as described above. Then, the supply of the gas by the gas supply 110 is stopped, and the circuit operation of the measuring device 1 is stopped, such that the holding of the measuring device 1 by the electrostatic chuck 108 is stopped. Then, the measuring device 1 is transferred from the chamber 102 to the load port by the transfer system.

Hereinafter, descriptions will be made on some embodiments of a measuring unit that may be adopted as each of the one or more measuring units 3 of the measuring device 1.

Figure 9:
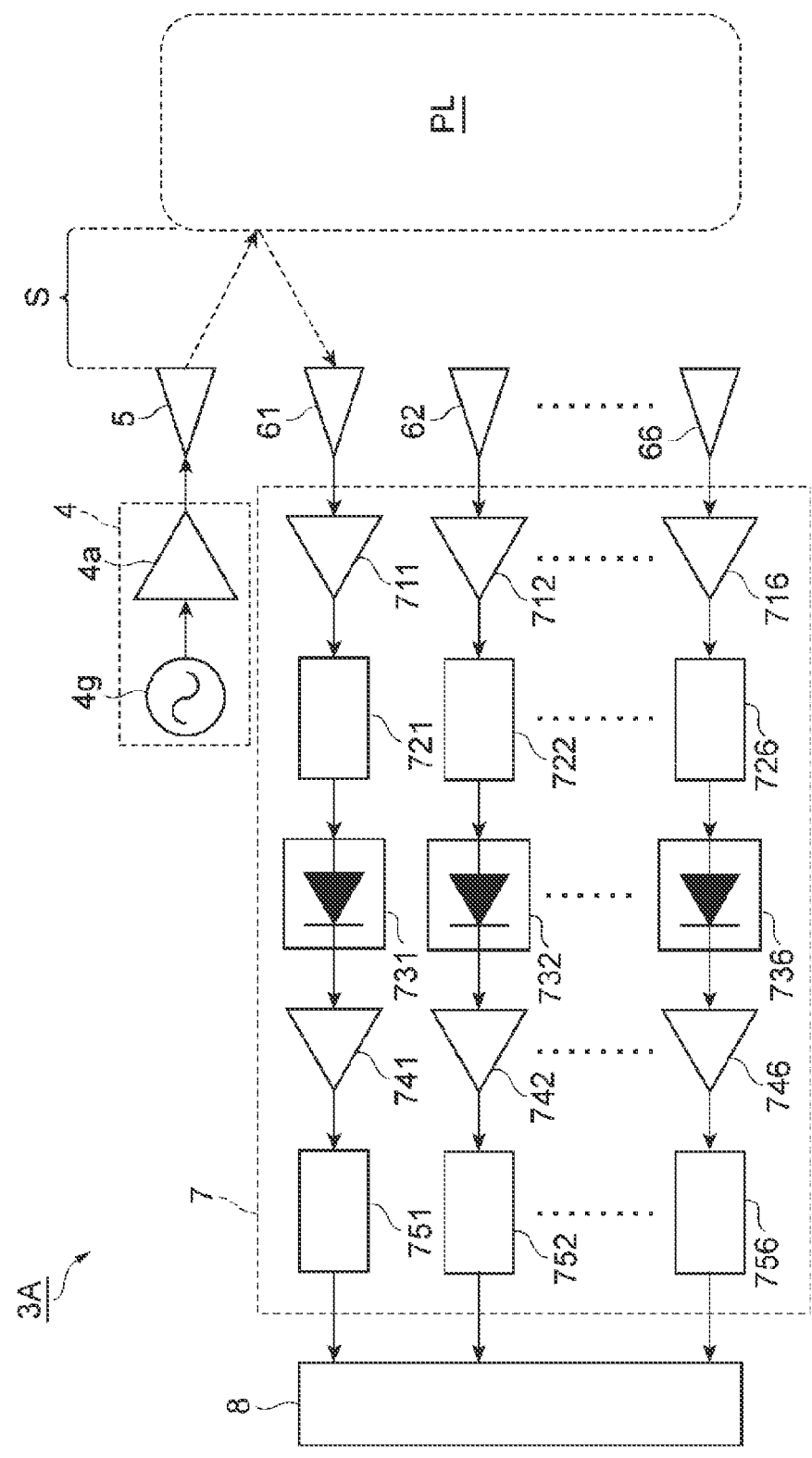
FIG. 9 is a view illustrating a measuring unit according to an embodiment.

FIG. 9 is a view illustrating a measuring unit according to an embodiment. A measuring unit 3A illustrated in FIG. 9 may be adopted as each of the one or more measuring units 3 of the measuring device 1. In the measuring unit 3A, the transmission circuit 4 includes a microwave oscillator 4g and an amplifier 4a. In the measuring unit 3A, the transmission circuit 4 outputs a microwave which is a continuous wave, to the transmitting antenna 5.

The measuring unit 3A includes receiving antennas 61 to 66 as the at least one receiving antenna 6. The transmitting antenna 5 and the receiving antennas 61 to 66 are arranged along the X direction. The number of receiving antennas in the measuring unit 3A may be any of two or more.

In the measuring unit 3A, the reception demodulation circuit 7 includes first amplifiers 711 to 716, bandpass filters 721 to 726, detection diodes 731 to 736, second amplifiers 741 to 746, and A/D converters 751 to 756. In the reception demodulation circuit 7 of the measuring unit 3A, the number of first amplifiers, the number of bandpass filters, the number of detection diodes, the number of second amplifiers, and the number of A/D converters are each the same as the number of receiving antennas of the measuring unit 3A.

The inputs of the first amplifiers 711 to 716 are connected to the receiving antennas 61 to 66, respectively. The first amplifiers 711 to 716 amplify a plurality of reception waves that are received by the receiving antennas 61 to 66, respectively, so as to generate a plurality of amplification signals. The first amplifiers 711 to 716 output the plurality of generated amplification signals from their outputs, respectively.

The inputs of the bandpass filters 721 to 726 are connected to the outputs of the first amplifiers 711 to 716, respectively. The pass band of each of the bandpass filters 721 to 726 is a band for selectively passing a signal having the same frequency as the frequency of a transmission wave. The bandpass filters 721 to 726 perform a filtering for the plurality of amplification signals from the first amplifiers 711 to 716, respectively, so as to generate a plurality of filtration signals. The bandpass filters 721 to 726 output the plurality of generated filtration signals from the outputs thereof.

The inputs of the detection diodes 731 to 736 are connected to the outputs of the bandpass filters 721 to 726, respectively. The detection diodes 731 to 736 perform a detection for the plurality of filtration signals from the bandpass filters 721 to 726, respectively, so as to generate a plurality of detection signals. The detection diodes 731 to 736 output the plurality of generated detection signals from the outputs thereof, respectively.

The inputs of the second amplifiers 741 to 746 are connected to the outputs of the detection diodes 731 to 736, respectively. The second amplifiers 741 to 746 amplify the plurality of detection signals from the detection diodes 731 to 736, respectively, so as to generate a plurality of amplification signals. The second amplifiers 741 to 746 output the plurality of generated amplification signals from the outputs thereof, respectively.

The inputs of the A/D converters 751 to 756 are connected to the outputs of the second amplifiers 741 to 746, respectively. The A/D converters 751 to 756 perform an A/D conversion process for the plurality of amplification signals from the second amplifiers 741 to 746, respectively, so as to generate a plurality of digital signals. The A/D converters 751 to 756 output the plurality of generated digital signals from the outputs thereof, respectively. The plurality of digital signals generated by the A/D converters 751 to 756 represent the reception wave intensities in the receiving antennas 61 to 66, respectively. The plurality of digital signals generated by the A/D converters 751 to 756 are input to the calculator 8 as signals that reflect the thickness of the sheath S.

The calculator 8 receives the plurality of digital signals from the A/D converters 751 to 756. The calculator 8 specifies the thickness of the sheath S that corresponds to a combination of the reception wave intensities of the respective receiving antennas 61 to 66 that are specified from the digital signals. The calculator 8 may hold in advance the relationship between the combination of the reception wave intensities in the respective receiving antennas 61 to 66 and the thickness of the sheath S as a table or function. The calculator 8 may obtain the thickness of the sheath S, using the table or function.

The reception wave intensity in each of the receiving antennas 61 to 66 depends on the thickness of the sheath S. Thus, according to the measuring unit 3A, it becomes possible to obtain the thickness of the sheath S from the combination of the reception wave intensities in the respective receiving antennas 61 to 66.

Figure 10:
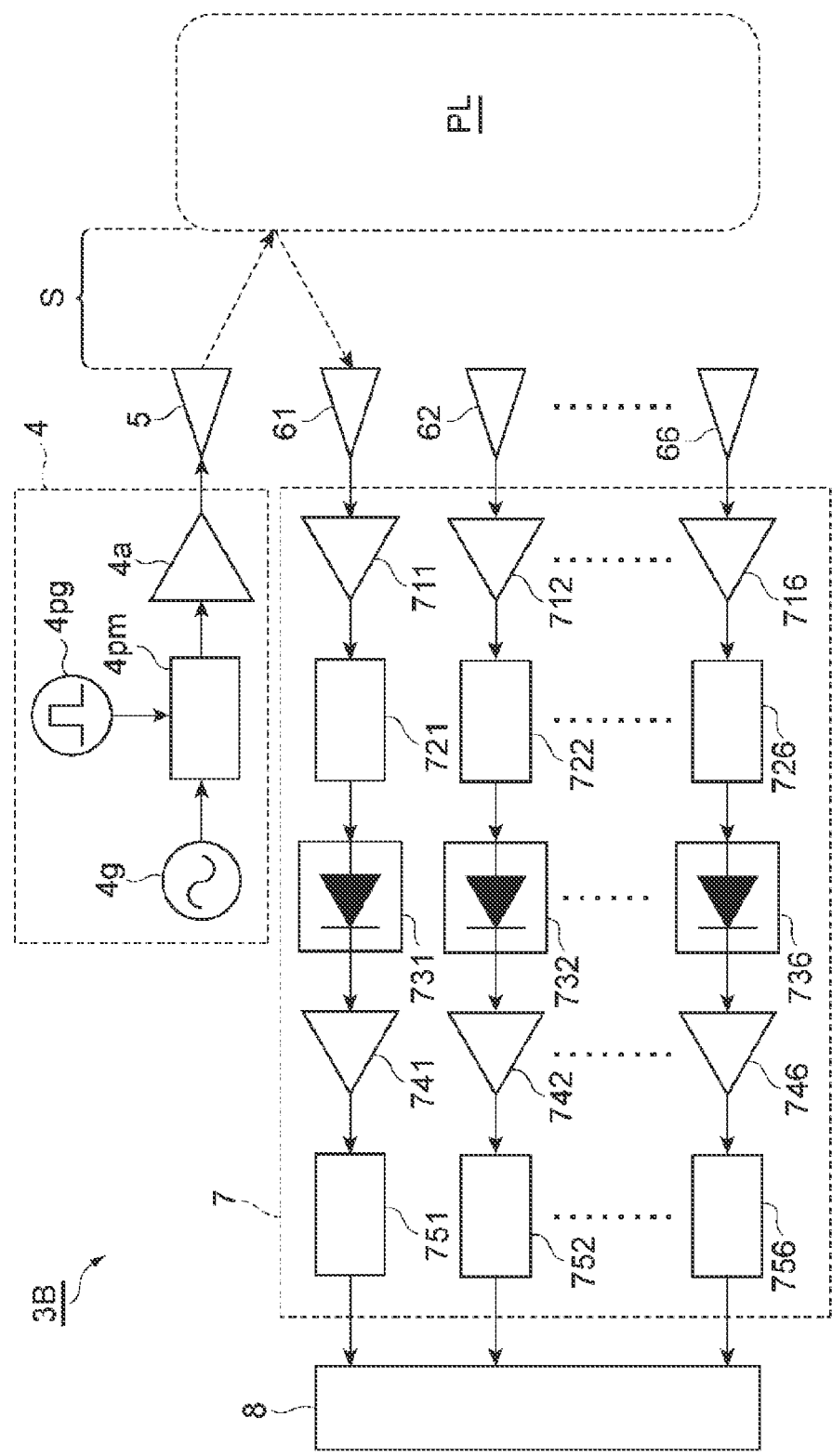
FIG. 10 is a view illustrating a measuring unit according to another embodiment.

Hereinafter, FIG. 10 will be referred-to. FIG. 10 is a view illustrating a measuring unit according to another embodiment. A measuring unit 3B illustrated in FIG. 10 may be adopted as each of the one or more measuring units 3 of the measuring device 1. In the measuring unit 3B, the transmission circuit 4 includes a microwave oscillator 4g, a pulse oscillator 4pg, a pulse modulator 4pm, and an amplifier 4a. In the measuring unit 3B, the transmission circuit 4 outputs a microwave pulse. The pulse oscillator 4pg generates a pulse signal. The pulse modulator 4pm modulates the amplitude of the microwave from the oscillator 4g using the pulse signal, so as to generate a microwave pulse. The amplifier 4a amplifies the microwave pulse generated by the pulse modulator 4pm, and outputs the amplified microwave pulse to the transmitting antenna 5. The transmitting antenna 5 emits the amplified microwave pulse as a transmission wave.

The measuring unit 3B includes receiving antennas 61 to 66 as the at least one receiving antenna 6. The transmitting antenna 5 and the receiving antennas 61 to 66 are arranged along the X direction. The number of receiving antennas in the measuring unit 3B may be any of one or more.

The reception demodulation circuit 7 of the measuring unit 3B has the same configuration as that of the reception demodulation circuit 7 of the measurement unit 3A. That is, in the measuring unit 3B, the reception demodulation circuit 7 includes the first amplifiers 711 to 716, the bandpass filters 721 to 726, the detection diodes 731 to 736, the second amplifiers 741 to 746, and the A/D converters 751 to 756. In the reception demodulation circuit 7 of the measuring unit 3B, the number of first amplifiers, the number of bandpass filters, the number of detection diodes, the number of second amplifiers, and the number of A/D converters are each the same as the number of the receiving antennas of the measuring unit 3B.

In the measuring unit 3B, the transmission wave is a microwave pulse. Accordingly, the reception wave in each of the receiving antennas 61 to 66 is also a microwave pulse. Thus, each of the digital signals generated by the A/D converters 751 to 756 also includes a pulse. The pulse in each of the plurality of digital signals generated by the A/D converters 751 to 756 has a delay time with respect to the transmission timing of the transmission wave (microwave pulse). The delay time depends on the thickness of the sheath S.

In the measuring unit 3B, the calculator 8 receives the plurality of digital signals from the A/D converters 751 to 756. From the digital signals, the calculator 8 specifies the delay times of the reception timings of the plurality of reception waves (i.e., microwave pulses) in the respective receiving antennas 61 to 66 with respect to the transmission timings of the transmission waves (microwave pulses). The calculator 8 obtains the thickness of the sheath S from the delay times. The calculator 8 may obtain a plurality of thicknesses that correspond to the delay times, so as to obtain an average value of the plurality of thicknesses as the thickness of the sheath S. The thickness Sth of the sheath S specified from each digital signal may be obtained from the following equation (1). In the equation (1), "c" refers to the light speed, "t" refers to the delay time, and "L" refers to the distance in the X direction between the receiving antenna that receives the reception wave having the delay time and the transmitting antenna.

$$Sth = \sqrt{c^2 t^2 - \frac{L^2}{4}} \quad (1)$$

According to the measuring unit 3B, by using the microwave pulses as the transmission waves, the thickness of the sheath S may be obtained from the delay times of the reception waves. Further, the transmission wave may be modulated by a TDMA method, instead of being modulated using a pulse signal from the pulse oscillator 4pg.

Figure 11:
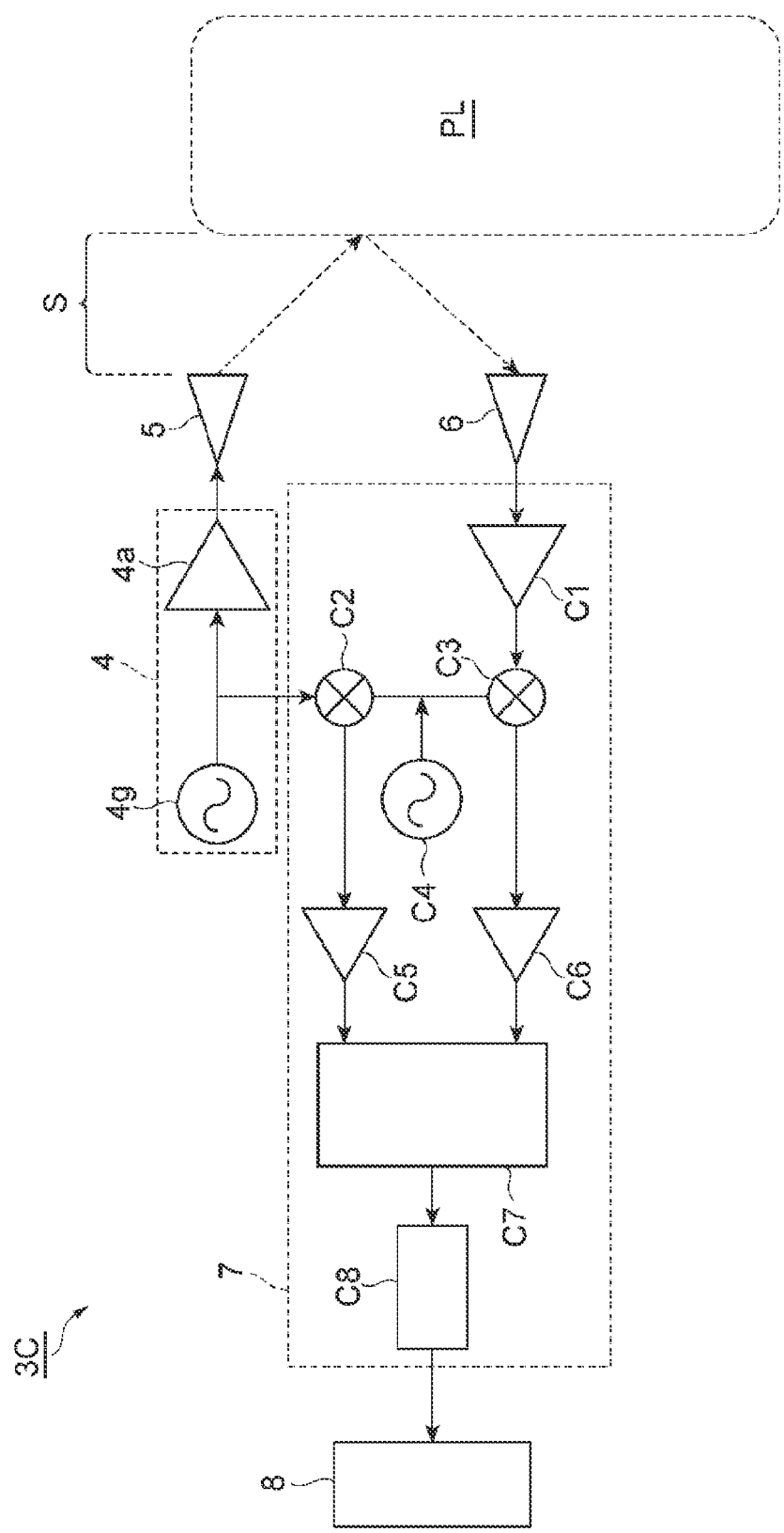
FIG. 11 is a view illustrating a measuring unit according to yet another embodiment.

Hereinafter, FIG. 11 will be referred-to. FIG. 11 is a view illustrating a measuring unit according to yet another embodiment. A measuring unit 3C illustrated in FIG. 11 may be adopted as each of the one or more measuring units 3 of the measuring device 1. In the measuring unit 3C, the transmission circuit 4 includes a microwave oscillator 4g and an amplifier 4a. In the measuring unit 3C, the transmission circuit 4 outputs a microwave which is a continuous wave, to the transmitting antenna 5.

The measuring unit 3C includes one receiving antenna 6. The transmitting antenna 5 and the receiving antenna 6 are arranged along the X direction. The number of receiving antennas in the measuring unit 3C may be two or more.

In the measuring unit 3C, the reception demodulation circuit 7 includes an amplifier C1, mixers C2 and C3, a local oscillator C4, amplifiers C5 and C6, a phase detector C7, and an A/D converter C8. In the measuring unit 3C, the microwave from the oscillator 4g is output to not only the amplifier 4a but also the mixer C2. A local oscillator C4 is connected to the mixer C2. The mixer C2 mixes the microwave from the oscillator 4g and the signal from the local oscillator C4, so as to generate a first intermediate frequency signal. The output of the mixer C2 is connected to the input of the amplifier C5. The amplifier C5 amplifies the first intermediate frequency signal, so as to generate a first amplification signal. The amplifier C5 outputs the first amplification signal from the output thereof. The output of the amplifier C5 is connected to the first input of the phase detector C7.

The input of the first amplifier C1 is connected to the receiving antenna 6. The amplifier C1 amplifies the reception wave from the receiving antenna 6 to generate an amplification signal. The amplifier C1 outputs the generated amplification signal from the output thereof. The output of the amplifier C1 is connected to the mixer C3. A local oscillator C4 is connected to the mixer C3. The mixer C3 mixes the amplification signal from the amplifier C1 and the signal from the local oscillator C4, so as to generate a second intermediate frequency signal. The output of the mixer C3 is connected to the input of the amplifier C6. The amplifier C6 amplifies the second intermediate frequency signal, so as to generate a second amplification signal. The amplifier C6 outputs the second amplification signal from the output thereof. The output of the amplifier C6 is connected to the second input of the phase detector C7.

The phase detector C7 outputs a voltage having a level that corresponds to the phase difference between the first amplification signal and the second amplification signal, that is, the phase difference between the transmission wave and the reception wave, from the output thereof. The output of the phase detector C7 is connected to the input of the A/D converter C8. The A/D converter C8 performs an A/D conversion process for the signal received in the input thereof, so as to generate a digital signal. The A/D converter C8 outputs the generated digital signal from the output thereof. The digital signal generated by the A/D converter C8 is input to the calculator 8 as a signal that reflects the thickness of the sheath S.

The calculator 8 receives the digital signal from the A/D converter 8. The calculator 8 specifies the phase difference $\varphi$ between the transmission wave and the reception wave from the digital signal. The phase difference $\varphi$ is obtained by $\varphi = K \cdot V$. The "V" refers to the level of the output voltage of the phase detector C7 that is specified from the digital signal. The "K" refers to a phase sensitivity constant and is predetermined. The calculator 8 obtains the thickness Sth of the sheath S by the arithmetic operation of $Sth = \varphi \cdot c/(4\pi f)$. Here, "c" refers to the light speed, and "f" refers to a frequency of a transmission wave.

When the measuring unit 3C includes a plurality of receiving antennas, the reception demodulation circuit 7 includes a plurality of sets that each includes the amplifier C1, the mixers C2 and C3, the local oscillator C4, the amplifiers C5 and C6, the phase detector C7, and the A/D converter C8. In this case, the calculator 8 may obtain an average value of a plurality of thicknesses obtained from digital signals generated by the respective A/D converters C8 of the plurality of sets as the thickness of the sheath S.

Figure 12:
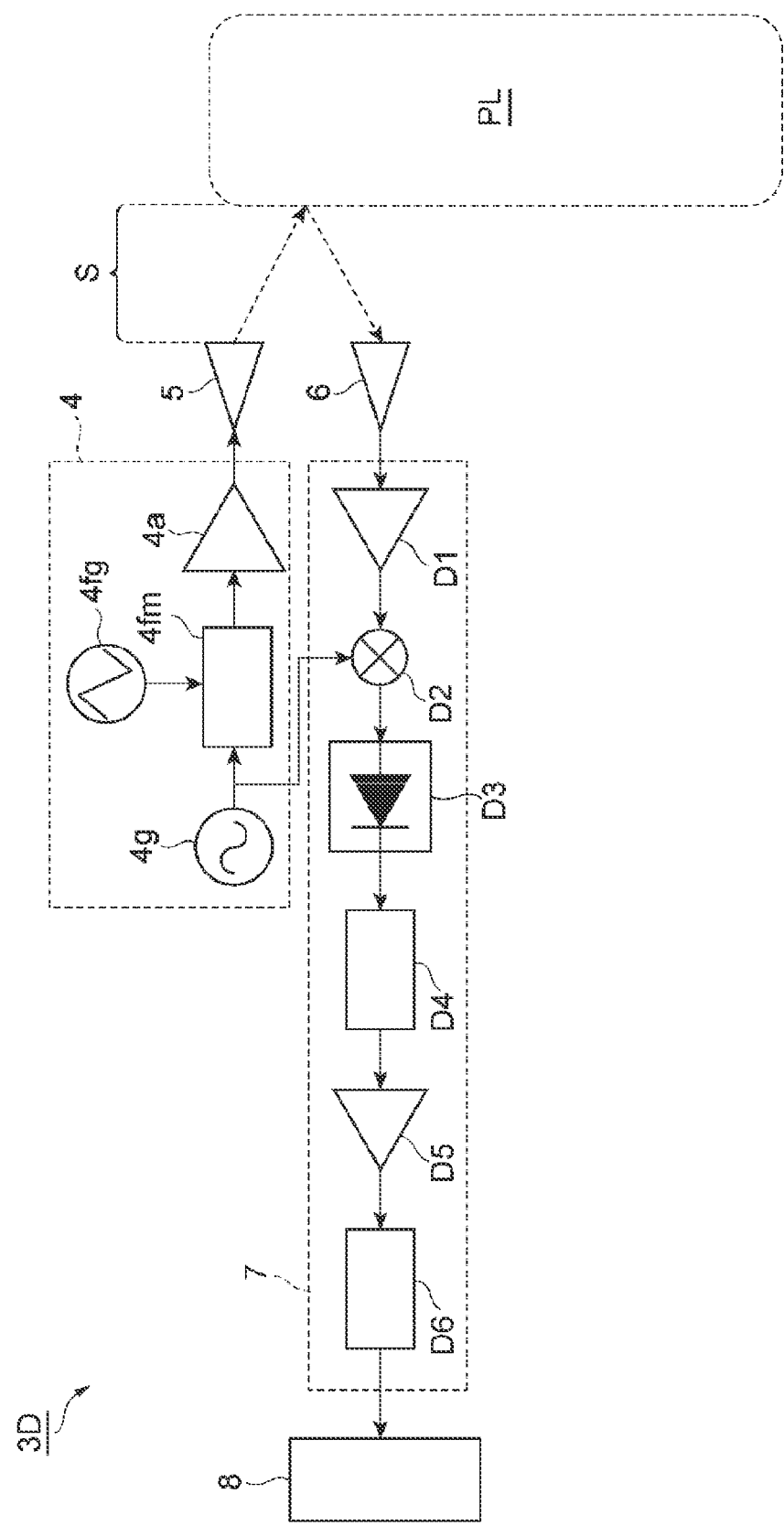
FIG. 12 is a view illustrating a measuring unit according to yet another embodiment.

Hereinafter. FIG. 12 will be referred-to. FIG. 12 is a view illustrating a measuring unit according to yet another embodiment. A measuring unit 3D illustrated in FIG. 12 may be adopted as each of the one or more measuring units 3 of the measuring device 1. In the measuring unit 3D, the transmission circuit 4 includes a microwave oscillator 4g, a signal generator 4fg, a modulator 4fm, and an amplifier 4a. In the measuring unit 3D, the transmission circuit 4 outputs a microwave of which frequency alternately and monotonically increases and decreases. The modulator 4fm modulates the frequency of the microwave from the oscillator 4g by using a signal from the signal generator 4fg, so as to generate a modulated microwave. The amplifier 4a amplifies the modulated microwave that is generated by the modulator 4fm, and outputs the amplified microwave to the transmitting antenna 5. The transmitting antenna 5 emits the amplified modulated microwave as a transmission wave.

The measuring unit 3D includes one receiving antenna 6. The transmitting antenna 5 and the receiving antenna 6 are arranged along the X direction. The number of receiving antennas in the measuring unit 3D may be two or more.

In the measuring unit 3D, the reception demodulation circuit 7 includes an amplifier D1, a mixer D2, a detection diode D3, a bandpass filter D4, an amplifier D5, and an A/D converter C6. The input of the amplifier D1 is connected to the receiving antenna 6. The amplifier D1 amplifies the reception wave from the receiving antenna 6, so as to generate an amplification signal. The amplifier D1 outputs the generated amplification signal from the output thereof. The output of the amplifier D1 is connected to the mixer D2. The oscillator 4g is connected to the mixer D2. The mixer D2 mixes the amplification signal from the amplifier D1 and the microwave from the oscillator 4g, so as to generate a signal having a beat frequency.

A time difference occurs between a timing when a transmission wave is transmitted and a timing when a reception wave is received by the receiving antenna 6 as a reflected wave of the transmission wave by the plasma PL. That is, the reception wave has a delay time. The delay time depends on the thickness of the sheath S. A signal obtained by mixing the transmission wave and the reception wave at the same timing is a signal having a beat frequency that corresponds to the delay time of the reception wave. Accordingly, the signal generated by the mixer D2 has a beat frequency that reflects the thickness of the sheath S.

The detection diode D3 generates a detection signal from the signal generated by the mixer D2. The detection diode D3 outputs the detection signal from the output thereof. The output of the detection diode D3 is connected to the input of the bandpass filter D4. The pass band of the bandpass filter D4 is a band for selectively passing a signal having a beat frequency. The bandpass filter D4 generates a filtration signal by filtering the detection signal from the detection diode D3. The bandpass filter D4 outputs the generated filtration signal from the output thereof.

The input of the amplifier D5 is connected to the output of the bandpass filter D4. The amplifier D5 amplifies the filtration signal, so as to generate an amplification signal. The amplifier D5 outputs the generated amplification signal from the output thereof. The input of the A/D converter D6 is connected to the output of the amplifier D5. The A/D converter D6 performs an A/D conversion process for the amplification signal from the amplifier D5, so as to generate a digital signal. The generated digital signal has a beat frequency that reflects the thickness of the sheath S.

The calculator 8 receives the digital signal from the A/D converter D6. The calculator 8 specifies the beat frequency from a spectrum obtained by applying, for example, a fast Fourier transform (FFT) to the digital signal. The calculator 8 obtains the thickness of the sheath S that corresponds to the specified beat frequency. The calculator 8 may hold in advance the relationship between the beat frequency and the thickness of the sheath S as a table or function. The calculator 8 may obtain the thickness of the sheath S, using the table or function.

When the measuring unit 3D includes a plurality of receiving antennas, the reception demodulation circuit 7 includes a plurality of sets that each includes the amplifier D1, the mixer D2, the detection diode D3, the bandpass filter D4, the amplifier D5, and the A/D converter D6. In this case, the calculator 8 may obtain an average value of a plurality of thicknesses obtained from the digital signals generated by the respective A/D converters D6 of the plurality of sets as the thickness of the sheath S.

Figure 13:
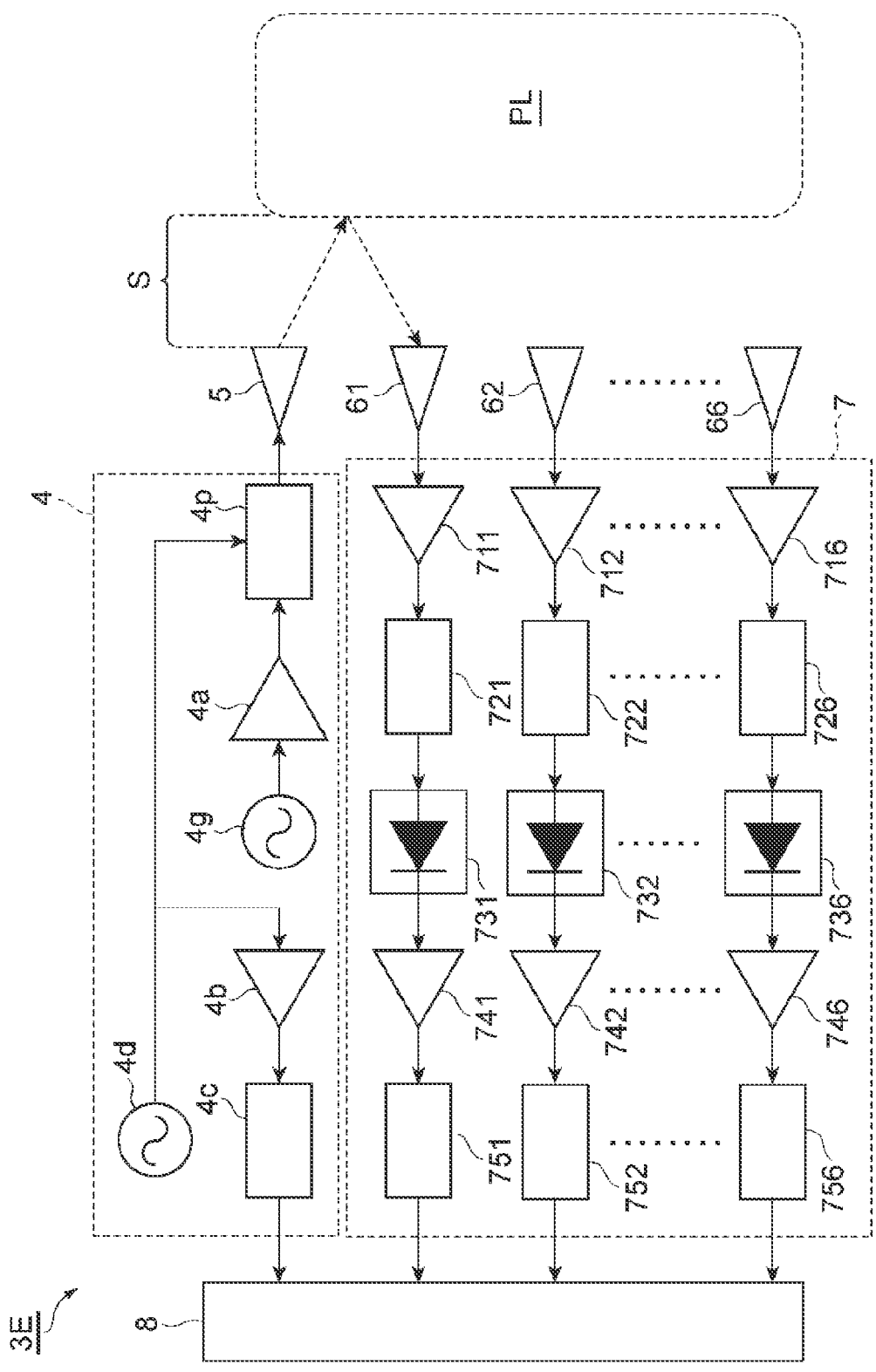
FIG. 13 is a view illustrating a measuring unit according to yet another embodiment.

Hereinafter. FIG. 13 will be referred-to. FIG. 13 is a view illustrating a measuring unit according to yet another embodiment. A measuring unit 3E illustrated in FIG. 13 may be adopted as each of the one or more measuring units 3 of the measuring device 1. The measuring unit 3E is configured to scan the transmission direction of a transmission wave such that the angle θ formed by the transmission direction of the transmission wave transmitted from the transmitting antenna 5 with respect to the substrate 2 increases or decreases. In the measuring unit 3E, the transmitting antenna 5 may have the configuration illustrated in FIG. 8.

In the measuring unit 3E, the transmission circuit 4 includes a microwave oscillator 4g, an amplifier 4a, a phase shifter group 4p, a signal generator 4d, an amplifier 4b, and an A/D converter 4c. In the transmission circuit 4, the oscillator 4g generates a microwave which is a continuous wave. The amplifier 4a amplifies the microwave from the oscillator 4g, and outputs the amplified microwave to the phase shifter group 4p.

The phase shifter group 4p includes a plurality of phase shifters as described with reference to FIG. 8. A plurality of microwaves is individually given to the plurality of phase shifters from the amplifier 4a. The plurality of microwaves are given to the plurality of antenna element groups of the transmitting antenna 5 after individual phases are given to the plurality of phase shifters of the phase shifter group 4p, respectively. The plurality of phase shifters of the phase shifter group 4p change the phases of the microwaves given to the plurality of transmitting antenna groups of the transmitting antenna 5, respectively, in synchronization with a reference signal from the signal generator 4d. As a result, the transmission direction of the transmission wave transmitted from each of the plurality of transmitting antenna groups of the transmitting antenna 5 is scanned such that the angle θ of the transmission wave increases or decreases in a cycle specified by the frequency (predetermined frequency) of the reference signal. The reference signal has a frequency lower than the frequency of the microwave. The frequency of the reference signal is, for example, 1 Hz or more and 1 kHz or less.

The output of the signal generator 4d is connected to the input of the A/D converter 4c via the amplifier 4b. The reference signal is amplified by the amplifier 4b, and input to the A/D converter 4c. The A/D converter 4c performs an A/D conversion process for the amplified reference signal, so as to generate a digital signal (hereinafter, referred to as a "reference digital signal"). The reference digital signal generated by the A/D converter 4c is provided to the calculator 8.

The measuring unit 3E includes receiving antennas 61 to 66 as the at least one receiving antenna 6. The transmitting antenna 5 and the receiving antennas 61 to 66 are arranged along the X direction. The number of receiving antennas in the measuring unit 3E may be any of one or more.

The reception demodulation circuit 7 of the measuring unit 3E has the same configuration as that of the reception demodulation circuit 7 of the measurement unit 3A. That is, in the measuring unit 3E, the reception demodulation circuit 7 includes the first amplifiers 711 to 716, the bandpass filters 721 to 726, the detection diodes 731 to 736, the second amplifiers 741 to 746, and the A/D converters 751 to 756. In the measuring unit 3E, each of the bandpass filters 721 to 726 has a pass band through which a component having the same frequency as the frequency of the reference signal selectively passes. In the reception demodulation circuit 7 of the measuring unit 3E, the number of first amplifiers, the number of bandpass filters, the number of detection diodes, the number of second amplifiers, and the number of A/D converters are each the same as the number of the receiving antennas of the measuring unit 3E.

In the measuring unit 3E, the digital signal output from each of the A/D converters 751 to 756 has a phase difference with respect to the reference digital signal. The phase difference depends on the thickness of the sheath S.

In the measuring unit 3E, the calculator 8 receives a plurality of digital signals from the A/D converters 751 to 756. The calculator 8 specifies the phase difference of each of the plurality of digital signals from the A/D converters 751 to 756 with respect to the reference digital signal. The calculator 8 obtains the thickness of the sheath S from the phase differences.

The calculator 8 may obtain a plurality of thicknesses that corresponds to the phase differences, and may obtain an average value of the plurality of thicknesses as the thickness of the sheath S. The thickness Sth of the sheath S specified from the digital signals from the respective A/D converters 751 to 756 may be obtained from the equation (1) above. In the equation (1) used by the calculator 8 of the measuring unit 3E, "c" refers to the light speed, "t" refers to a phase difference (delay time), and "L" refers to a distance between the receiving antenna that receives a reception wave corresponding to a digital signal having the phase difference and the transmitting antenna.

According to an embodiment, the thickness of a sheath may be obtained without providing a dedicated measuring device in a plasma processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A measuring device comprising:
   a substrate disposed on a substrate support of a plasma processing apparatus;
   a transmission circuit provided in the substrate, and configured to generate a microwave;
   a transmitting antenna provided in the substrate, and configured to transmit the microwave generated by the transmission circuit as a transmission wave;
   at least one receiving antenna provided in the substrate, and configured to receive a reflected wave of the transmission wave by plasma above the substrate support as at least one reception wave;
   a reception demodulation circuit provided in the substrate, and configured to generate at least one signal that reflects a thickness of a sheath between the substrate and the plasma, from the at least one reception wave; and
   a calculator provided in the substrate, and configured to obtain the thickness from the at least one signal.

2. The measuring device according to claim 1, wherein a plurality of receiving antennas is provided as the at least one receiving antenna,
   the plurality of receiving antennas are arranged along a direction component of a transmission direction of the transmission wave which is parallel to the substrate,
   the reception demodulation circuit is configured to generate a plurality of signals that represents intensities of a plurality of reception waves received by the plurality of receiving antennas, respectively, and
   the calculator is configured to obtain the thickness from the plurality of signals.

3. The measuring device according to claim 1, wherein the transmitting antenna transmits a pulse of the microwave output from the transmission circuit as the transmission wave,
   the reception demodulation circuit is configured to generate the at least one signal that represents an intensity of the at least one reception wave, and
   the calculator is configured to obtain a delay time of the at least one reception wave with respect to the transmission wave from the at least one signal, and obtain the thickness from the delay time.

4. The measuring device according to claim 3, wherein a plurality of receiving antennas is provided as the at least one receiving antenna,
   the plurality of receiving antennas are arranged along a direction component of a transmission direction of the transmission wave which is parallel to the substrate,
   the reception demodulation circuit is configured to generate a plurality of signals that represents intensities of the plurality of reception waves received by the plurality of receiving antennas, respectively,
   the calculator is configured to obtain a plurality of delay times of the plurality of reception waves, respectively, with respect to the transmission wave from the plurality of signals, and obtain the thickness from the plurality of delay times.

5. The measuring device according to claim 1, wherein the reception demodulation circuit is configured to generate the at least one signal that represents a phase difference between the transmission wave and the at least one reception wave.

6. The measuring device according to claim 1, wherein the transmission circuit is configured to cause a frequency of the transmission wave to alternately and monotonically increase and decrease, and
   the reception demodulation circuit is configured to mix the transmission wave and the at least one reception wave, thereby generating an intermediate frequency signal having a beat frequency that reflects the thickness of the sheath as the at least one signal.

7. The measuring device according to claim 1, wherein the transmission circuit is configured to scan a transmission direction of the transmission wave to increase and decrease an angle formed by the transmission direction of the transmission wave with respect to the substrate in synchronization with a reference signal having a predetermined frequency which is lower than a frequency of the transmission wave,
   the reception demodulation circuit is configured to generate a signal of a predetermined frequency component that is included in the at least one reception wave, as the at least one signal, and
   the calculator is configured to obtain the thickness from a phase difference between the reference signal and the at least one signal.

8. The measuring device according to claim 1, wherein the transmission wave is a millimeter wave.

9. The measuring device according to claim 1, wherein a plurality of receiving antennas is provided as the at least one receiving antenna,
- the plurality of receiving antennas are arranged along a direction component of a transmission direction of the transmission wave which is parallel to the substrate,
- the reception demodulation circuit is configured to generate a plurality of signals that represents intensities of a plurality of reception waves received by the plurality of receiving antennas, respectively,
- the calculator is configured to obtain the thickness from the plurality of signals, and
- the transmission wave is a millimeter wave.

10. The measuring device according to claim 1, wherein the transmitting antenna transmits a pulse of the microwave output from the transmission circuit as the transmission wave,
- the reception demodulation circuit is configured to generate the at least one signal that represents an intensity of the at least one reception wave,
- the calculator is configured to obtain a delay time of the at least one reception wave with respect to the transmission wave from the at least one signal, and obtain the thickness from the delay time, and
- the transmission wave is a millimeter wave.

11. The measuring device according to claim 3, wherein a plurality of receiving antennas is provided as the at least one receiving antenna,
- the plurality of receiving antennas are arranged along a direction component of a transmission direction of the transmission wave which is parallel to the substrate,
- the reception demodulation circuit is configured to generate a plurality of signals that represents intensities of the plurality of reception waves received by the plurality of receiving antennas, respectively,
- the calculator is configured to obtain a plurality of delay times of the plurality of reception waves, respectively, with respect to the transmission wave from the plurality of signals, and obtain the thickness from the plurality of delay times, and
- the transmission wave is a millimeter wave.

12. The measuring device according to claim 1, wherein the reception demodulation circuit is configured to generate the at least one signal that represents a phase difference between the transmission wave and the at least one reception wave, and
- the transmission wave is a millimeter wave.

13. The measuring device according to claim 1, wherein the transmission circuit is configured to cause a frequency of the transmission wave to alternately and monotonically increase and decrease,
- the reception demodulation circuit is configured to mix the transmission wave and the at least one reception wave, thereby generating an intermediate frequency signal having a beat frequency that reflects the thickness of the sheath as the at least one signal, and
- the transmission wave is a millimeter wave.

14. The measuring device according to claim 1, wherein the transmission circuit is configured to scan a transmission direction of the transmission wave to increase and decrease an angle formed by the transmission direction of the transmission wave with respect to the substrate in synchronization with a reference signal having a predetermined frequency which is lower than a frequency of the transmission wave,
- the reception demodulation circuit is configured to generate a signal of a predetermined frequency component that is included in the at least one reception wave, as the at least one signal,
- the calculator is configured to obtain the thickness from a phase difference between the reference signal and the at least one signal, and
- the transmission wave is a millimeter wave.

15. A method of obtaining a thickness of a sheath, the method comprising:
- (a) placing a measuring device on a substrate support in a chamber of a plasma processing apparatus, the measuring device including:
  - a substrate disposed on the substrate support of the plasma processing apparatus,
  - a transmission circuit provided in the substrate, and configured to generate a microwave,
  - a transmitting antenna provided in the substrate, and configured to transmit the microwave generated by the transmission circuit as a transmission wave,
  - at least one receiving antenna provided in the substrate, and configured to receive a reflected wave of the transmission wave by plasma above the substrate support as at least one reception wave,
  - a reception demodulation circuit provided in the substrate, and configured to generate at least one signal that reflects the thickness of the sheath between the substrate and the plasma, from the at least one reception wave, and
  - a calculator provided in the substrate, and configured to obtain the thickness from the at least one signal;
- (b) generating plasma in the chamber of the plasma processing apparatus; and
- (c) while the plasma is generated in the chamber, obtaining the thickness from the at least one signal in the calculator of the measuring device placed on the substrate support.

* * * * *